(12) United States Patent
Marui et al.

(10) Patent No.: US 6,664,544 B1
(45) Date of Patent: Dec. 16, 2003

(54) MAGNETIC IMMERSION LENSE WITH DETECTION ARRANGEMENT

(75) Inventors: Takao Marui, Sale (GB); Ranjan Krishnachandra Badheka, Worsley (GB); Frank Henry Read, Macclesfield Forrest (GB)

(73) Assignee: Shimadzu Research Laboratory (Europe) Ltd., Manchester (GB)

( * ) Notice: Subject to any disclaimer, the term of this patent is extended or adjusted under 35 U.S.C. 154(b) by 0 days.

(21) Appl. No.: 09/936,875

(22) PCT Filed: Mar. 17, 2000

(86) PCT No.: PCT/GB00/00996

§ 371 (c)(1),
(2), (4) Date: Nov. 13, 2001

(87) PCT Pub. No.: WO00/57450

PCT Pub. Date: Sep. 28, 2000

(30) Foreign Application Priority Data

Mar. 19, 1999  (GB) .................................. 9906443

(51) Int. Cl.[7] .................................................. H01J 3/20
(52) U.S. Cl. ............................. 250/396 ML; 250/396 R
(58) Field of Search ........................ 250/396 ML, 310, 250/305, 396 R, 397, 399

(56) References Cited

U.S. PATENT DOCUMENTS

| | | |
|---|---|---|
| 4,551,625 A | 11/1985 | Lischke et al. |
| 4,728,790 A | 3/1988 | Plies |
| 4,926,054 A | 5/1990 | Frosien |
| 5,079,428 A | 1/1992 | Da Lin et al. |
| 6,194,729 B1 * | 2/2001 | Weimer ............... 250/396 ML |

FOREIGN PATENT DOCUMENTS

| | | |
|---|---|---|
| DE | 4 239 443 | 7/1993 |
| EP | 0 138 610 A2 | 4/1985 |
| EP | 0 242 993 A1 | 10/1987 |
| EP | 0 821 393 A1 | 1/1998 |
| WO | WO 98/14979 A1 | 4/1998 |

OTHER PUBLICATIONS

Yamamoto et al., "Development of High–Resolution Field Emission Scanning Electron Microscopy with Multifunctions for Chargeless Observation of Nonconducting Surface," *Scanning*, 19, 505–511 (1997).

Sato et al., "A snorkel type conical objective lense with E cross B field for detecting secondary electrons," *SPI*, 2014:17–23 (1993).

* cited by examiner

*Primary Examiner*—John R. Lee
*Assistant Examiner*—Christopher M. Kalivoda
(74) *Attorney, Agent, or Firm*—Leydig, Voit & Mayer, Ltd.

(57) ABSTRACT

A magnetic immersion lens has inner and outer pole-pieces arranged symmetrically about a longitudinal axis X-X of the lens, the inner pole piece having a through-bore and the lens producing a magnetic imaging field for directing along the through-bore secondary electrons emitted from a specimen positioned in front of the inner pole-piece. The lens has an axially-symmetric detection arrangement located within the through-bore. The detector comprises a focusser electrode, a repeller electrode, an extractor electrode, a detector electrode, and a reflector electrode

19 Claims, 4 Drawing Sheets

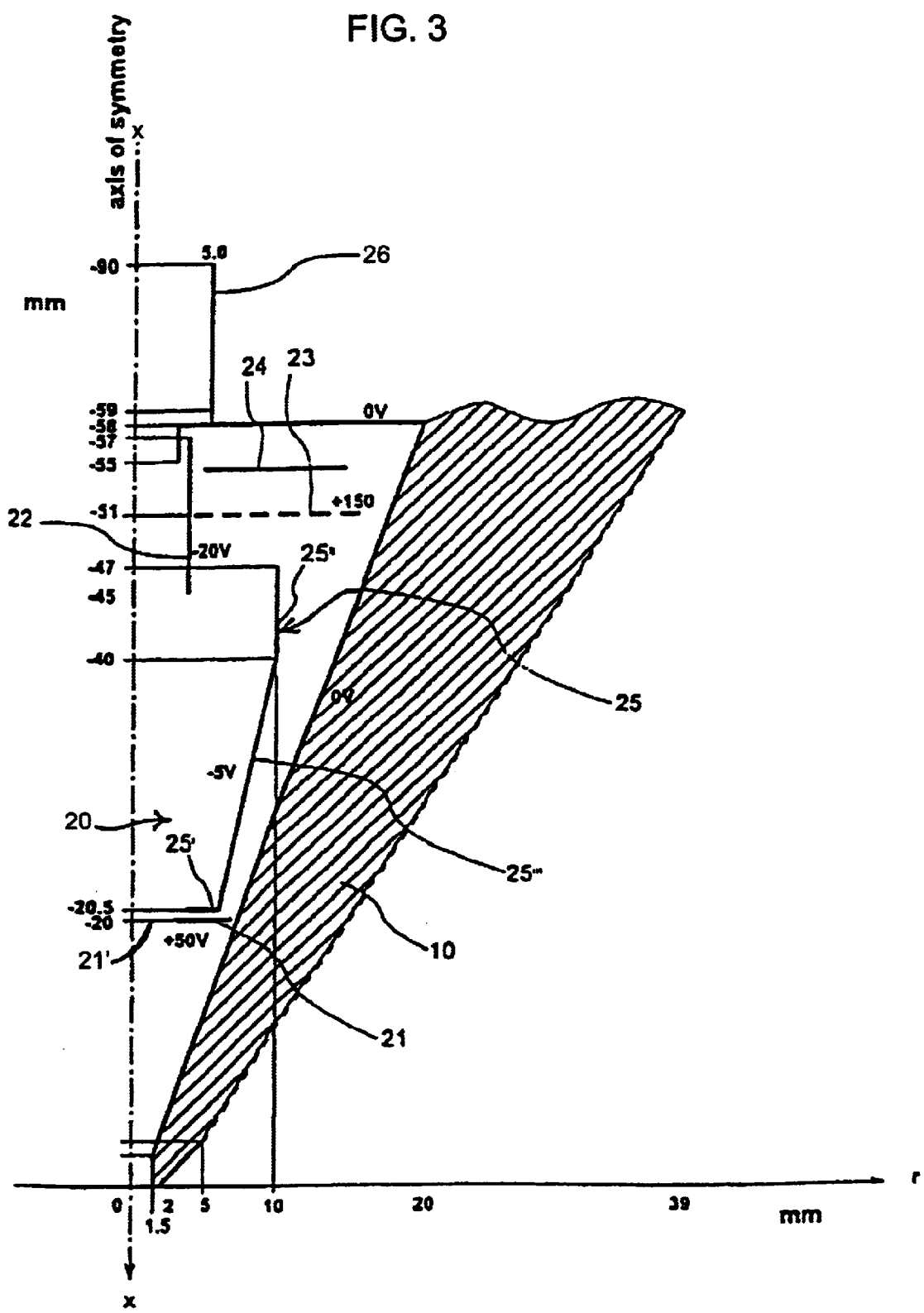

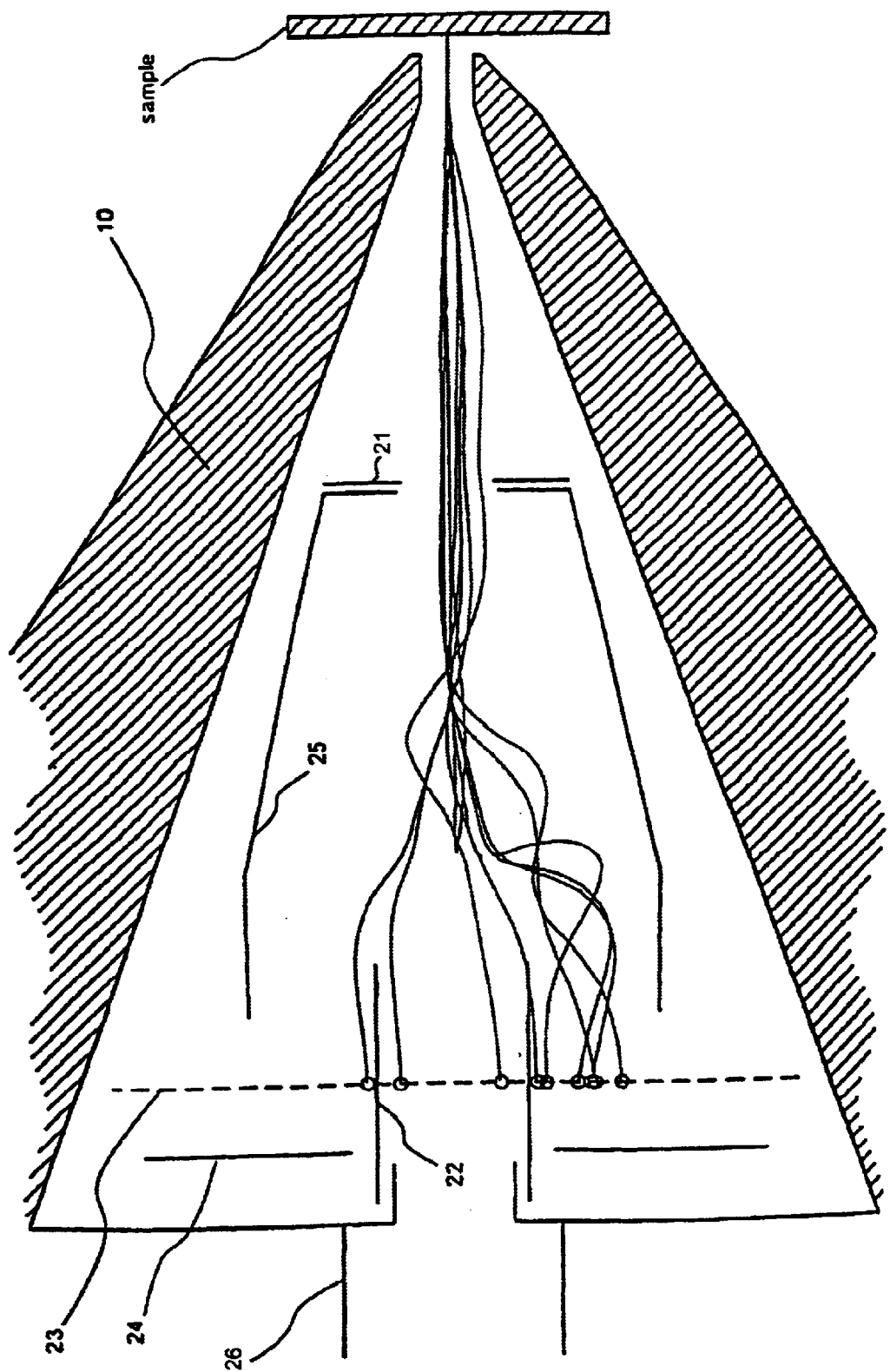
FIG. 4 VIEW THROUGH THE STRUCTURE

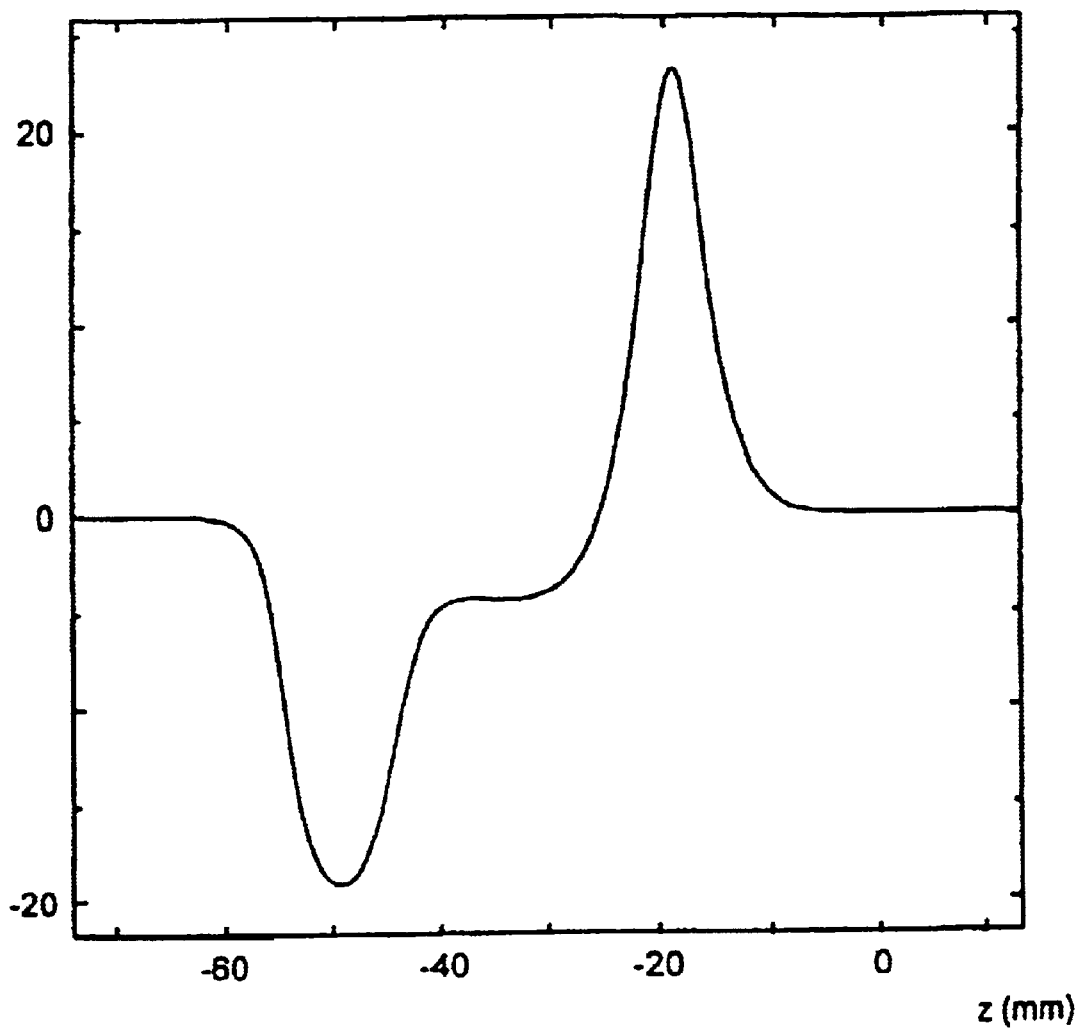

MAGNETIC IMMERSION LENSE WITH DETECTION ARRANGEMENT

FIELD OF THE INVENTION

This invention relates to magnetic immersion lenses.

BACKGROUND OF THE INVENTION

In particular, the invention relates to a magnetic immersion lens of the type comprising inner and outer pole-pieces arranged symmetrically about a longitudinal axis of the lens, the inner pole-piece having a through-bore. In use, a specimen is positioned in front of the tip end of the inner pole-piece at a suitable working distance, typically about 2 mm. An example of an inverted magnetic immersion lens is shown in FIG. 1.

In one application, the magnetic immersion lens forms part of an electron microscope, such as a scanning electron microscope. In this case, the magnetic imaging field of the lens constrains a beam of primary electrons to follow an axial trajectory along the through-bore and focuses the beam onto the specimen. Secondary electrons emitted from the specimen surface are guided into the through-bore by the magnetic imaging field and are detected by means of a secondary electron detection arrangement located within the through-bore. Due to the limited availability of space within the through-bore the detection arrangement needs to be of compact design, and this presents a significant technical problem.

Furthermore, a detection arrangement using electrostatic deflection fields may distort the magnetic imaging field of the lens causing, inter alia, a misalignment of the primary electron beam and a consequent deterioration in the electron optical properties of the microscope. This problem is particularly acute in the case of low voltage microscopy, particularly when the energy of the primary electrons is 1 keV or less.

A known, within-the-lens, secondary electron detection arrangement has the form of a Wein energy filter and is described by M. Sato, H. Todokoro, K. Kageyama—"A snorkel type conical objective lens with E cross B fields for detecting secondary electrons" SPIE, Vol 2014, Charged-Particle Optics (1993).

This detection arrangement has electrostatic deflectors for producing an electrostatic field. in a plane perpendicular to the axis of the primary electron beam which is used for the extraction of secondary electrons. The detection arrangement also has coils for producing a magnetic field perpendicular to, and in the same plane as, the electrostatic field. The strength and direction of the magnetic field are such that it compensates for the force exerted on the primary electron beam by the electrostatic field. Thus, there is no appreciable misalignment of the primary electron beam, even at energies as low as 1 keV. Nevertheless, the detection arrangement has a complex structure and is difficult to adjust to obtain the optimum result.

BRIEF SUMMARY OF THE INVENTION

According to the present invention there is provided a magnetic immersion lens comprising inner and outer pole-pieces arranged symmetrically about a longitudinal axis of the lens, the inner pole-piece having a through-bore and the lens producing a magnetic imaging field for directing, along said through-bore, charged particles emitted from a specimen positioned in front of the inner pole-piece, and an axialiv-symmetric, charged-particle detection arrangement located within the through-bore for detecting charged particles being directed along the through-bore by the magnetic imaging field, the charged-particle detection arrangement comprising repeller means for deflecting said charged particles away from the longitudinal axis and detector means for detecting charged particles deflected by the repeller means.

BRIEF DESCRIPTION OF THE DRAWINGS

Embodiments of the invention are now described, by way of example only, with reference to the accompanying drawings of which:

FIG. 3 gives a more detailed view of the detection arrangement used in the magnetic immersion lens of FIG. 2;

FIG. 4 illustrates a computer simulation of the detection arrangement; and

FIG. 5 shows the axial distribution of electrostatic potential within the region of the magnetic immersion tens occupied by the detection arrangement.

DETAILED DESCRIPTION OF THE INVENTION

Figure 1:
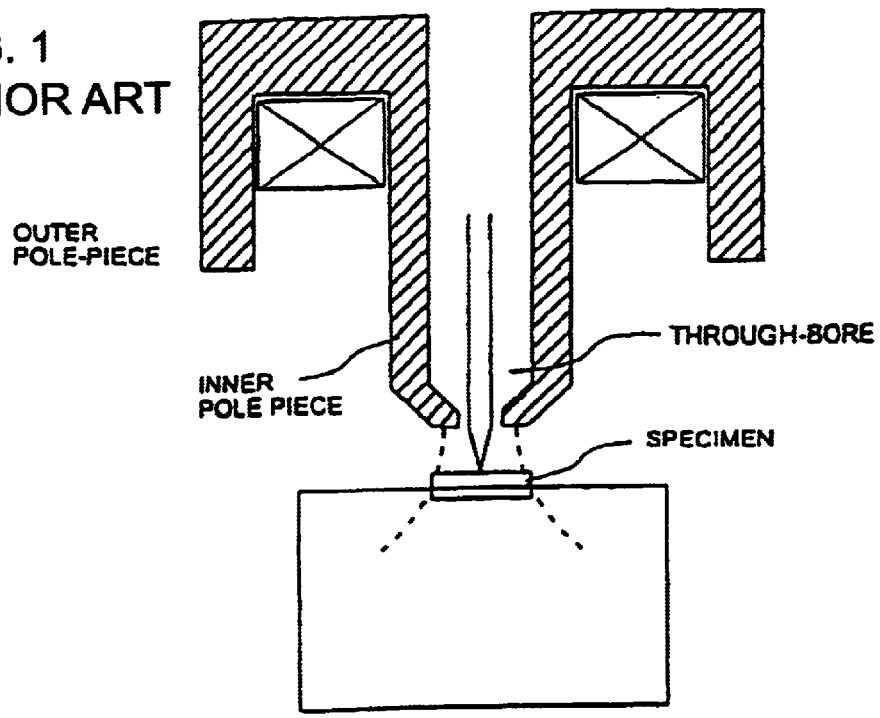
FIG. 1 is a longitudinal sectional view through a known magnetic immersion lens.
Figure 2:
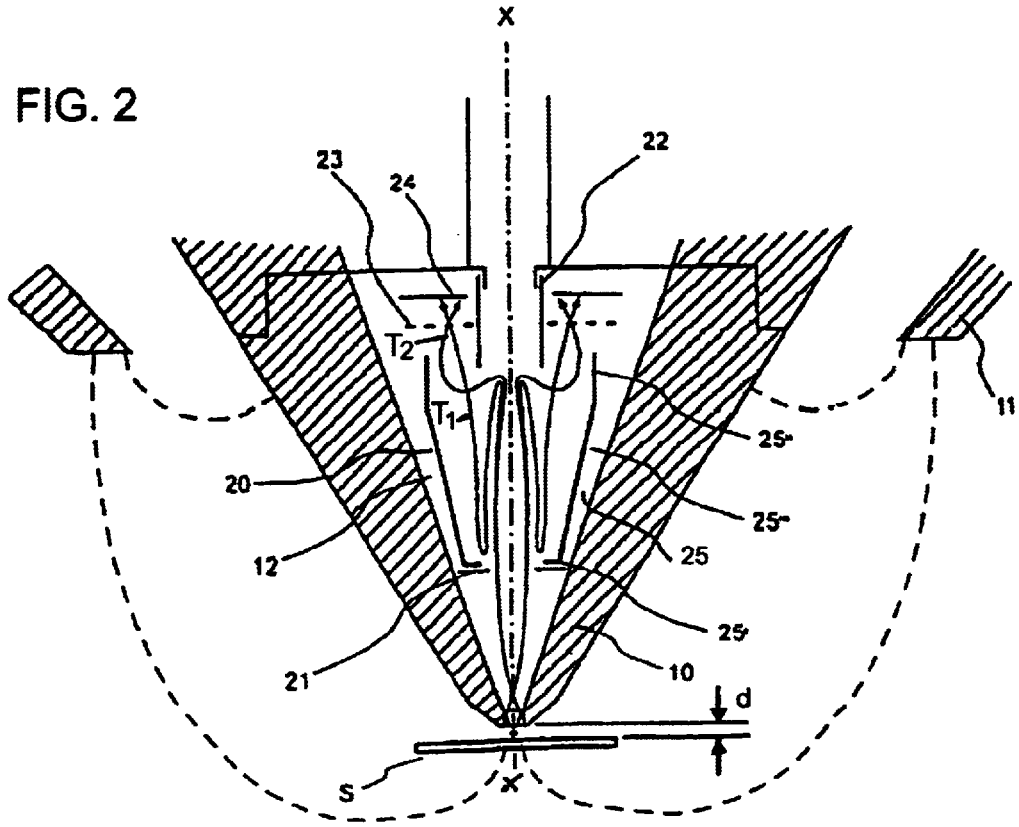
FIG. 2 is a longitudinal sectional view through part of a magnetic immersion lens according to the invention.

Referring to FIG. 2, the magnetic immersion lens is of the snorkel type comprising inner and outer pole-pieces 10,11 arranged symmetrically about a longitudinal axis X-X of the tens, the inner pole-piece 10 having a through-bore 12.

A specimen S is positioned in front of the tip end of the inner pole-piece 10 at a suitable working distance d, typically about 2 mm. Charged particles emitted from the surface of specimen S are constrained by the magnetic imaging field of the lens to enter the through-bore 12 of the inner pole-piece 10 where they follow a spiral trajectory and are detected by a detection arrangement 20 located within the through-bore 12. In this particular embodiment, the magnetic immersion lens is part of a scanning electron microscope; therefore, in this case, the charged particles are secondary electrons which are caused to be emitted from the specimen surface by a beam of primary electrons directed along the longitudinal axis X-X of the lens.

The detection arrangement 20 is shown in greater detail in FIG. 3. It consists of a number of electrodes disposed symmetrically about the longitudinal axis X-X; namely, a focusser electrode 21, a repeller electrode 22, an extractor electrode 23, a detector electrode 24 and a reflector electrode 25.

The focusser electrode 21 consists of an annular plate electrode positioned about 20 mm from the entrance to the through-bore 12. The electrode is maintained at a positive voltage $V_f$ of some +50 volts and is effective to accelerate secondary electrons entering the through-bore. The accelerated electrons pass through a central aperture 21' in the plate electrode and follow convergent trajectories towards the repeller electrode 22.

The repeller electrode 22 has the form of a cylindrical electrode which is centered on the longitudinal axis X-X and is maintained at a negative voltage $V_r$ of some −20V. The repeller electrode 22 turns the secondary electrons back towards the focusser electrode 21 and, at the same time, deflects the electrons away from the longitudinal axis X-X. FIG. 2 shows the trajectories $T_1$, $T_2$ of two such electrons, the electron following trajectory $T_1$ entering the through-bore with a different angle from the electron following trajectory $T_2$. The deflected electrons are accelerated towards the detector electrode 24 by means of the extractor electrode 23. The extractor and detector electrodes 23, 24 are both annular and are disposed around, but electrically isolated from, the repeller electrode 22, and they lie in respective planes perpendicular to the longitudal axis X-X. The extractor electrode 23 has the form of a mesh which is maintained at a positive voltage $V_e$ of some 150V, whereas the detector electrode 24 has the form of a plate electrode which is maintained at a positive voltage $V_d$ of +500V. The accelerated electrons pass through the mesh of electrode 23 to be detected by the detector electrode 24.

The reflector electrode 25 is positioned between the focusser electrode 21 and the repeller electrode 22, and is maintained at a negative voltage $V_r$ of some −5V. The reflector electrode is so shaped as to prevent secondary electrons deflected by the repeller electrode 22 from impinging on the walls of the inner pole-piece 10 and on the focusser electrode 21 and so being lost from the flux of electrons collected by the detector electrode 24. The negative voltage $V_r$ applied to the reflector electrode 25 may be adjusted to maximise the secondary electron signal detected by the detector electrode 24.

In this embodiment the reflector electrode 25 consists of an annular plate electrode 25' adjacent to the focusser electrode 21, a cylindrical electrode 25" axially overlapping the repeller electrode 22 and a truncated, conical electrode 25''' interconnecting the electrodes 25',25".

The effect of the repeller electrode 22 is to prevent the secondary electron trajectories from following the longitudinal axis further and to separate them from this axis. Furthermore, because the detection arrangement 20 is axially symmetric, the secondary electrons are guided to the detector electrode 24 without causing any significant distortion of the magnetic imaging field and a consequent misalignment of the primary electron beam.

In addition, a shield 26 limits the distribution of electrostatic potential to minimize its effect on the primary electron beam.

The axially-symmetric detection arrangement 20 shown in more detail in FIG. 3 has been modeled using computer simulation techniques. The model includes a magnetic imaging filed capable of focusing a 1 keV primary electron bean onto the surface of a specimen supported at a working distance of 2 mm. The computer simulation studies have demonstrated using a 1000 secondary electrons leaving the specimen surface at different angular trajectories and with a kinetic energy of 5 eV, that over 80% of the secondary electrons are incident on the detector electrode 24. FIG. 4 shows an example of this computer simulation whereby for clarity just 10 of the 1000 secondary electrons have been selected for view. FIG. 5 shows that the axial distribution $\phi(z)$ of electrostatic potential within the region of detector 20 is no greater than ±25V. Comparing this with a typical primary electron beam energy Ep of 1000 eV, the electrostatic distribution due to the effect of the detection arrangement should have little or no effect on the electro optical properties of the primary electron beam. This has been confirmed independently by other calculations which compare the lens aberration values of a high resolution electron probe formed by operating a magnetic lens with and without the detection arrangement.

In the embodiment of FIGS. 2 and 3 the detector electrode 24 has the form of an annular plate electrode. In alternative embodiments, a different form of detector means could be used; for example, an annular microchannel plate assembly, an annular solid state diode, an annular scintillator or a detection device consisting of a number of, preferably, electrically isolated sections.

What is claimed is:

1. A magnetic immersion lens comprising inner and outer pole-pieces arranged symmetrically about a longitudinal axis of the lens, the inner pole-piece having a through-bore and the lens producing a magnetic imaging field for directing, along said through-bore, charged particles emitted from a specimen positioned in front of the inner pole-piece, and an axially-symmetric charged-particle detection arrangement located within the through-bore for detecting charged particles being directed along the through-bore by the magnetic imaging field, the charged-particle detection arrangement comprising repeller means for deflecting said charged particles away from the longitudinal axis and detector means for detecting charged particles deflected by the repeller means.

2. A lens as claimed in claim 1 wherein said charged particle detection arrangement further comprises focusser means for converging said charged particles towards the repeller means.

3. A lens as claimed in claim 2 wherein the charged-particle detection arrangement further comprises reflector means for deflecting charged particles away from the sides of said through-bore and said focusser means.

4. A lens as claimed in claim 1 wherein said repeller means is arranged to cause said charged particles to move on trajectories towards the specimen before being detected by the detector means.

5. A lens as claimed in claim 1 wherein the detector means comprises an annular plate electrode centred on, and lying in a plane perpendicular to the longitudinal axis.

6. A lens as claimed in claim 5 wherein the charged-particle detection arrangement includes an extractor electrode for accelerating charged particles towards said annular plate electrode for detection.

7. A lens as claimed in claim 6 wherein the extractor electrode comprises an annular mesh lying in a plane parallel to, and spaced from the annular plate electrode of the detector means.

8. A lens as claimed in claim 1 wherein the detector means comprises an annular microchannel plate assembly.

9. A lens as claimed in claim 1 wherein the detector means comprises an annular solid state diode.

10. A lens as claimed in claim 1 wherein the detector means comprises an annular scintillator.

11. A lens as claimed in claim 1 wherein the detector means comprises a plurality of segments.

12. A lens as claimed in claim 11 wherein said segments are electrically isolated from each other.

13. A lens as claimed in claim 1 wherein said repeller means comprises a cylindrical electrode arranged symmetrically about the longitudinal axis of the through-bore and having the same polarity as the charged particles.

14. A lens as claimed in claim 1 wherein said charged particle detection arrangement further comprises focusser means for converging said charged particles towards the repeller means and reflector means, extending between said repeller means and said focusser means and being arranged to deflect charged particles, deflected by the repeller means, away from the focusser means and away from the sides of the lens through-bore.

15. A lens as claimed in claim 14 wherein the reflector means axially overlaps the repeller means.

16. A lens as claimed in claim 14 wherein the reflector means comprises an annular plate electrode adjacent to the focusser means, a cylindrical electrode adjacent to the repeller means and a truncated conical electrode interconnecting the annular plate electrode and the cylindrical electrode.

17. A lens as claimed in claim 1 wherein said charged particles are secondary electrons.

18. An electron microscope including a magnetic immersion lens as claimed in claim 1 and means for directing a beam of primary electrons along the through-bore of the magnetic immersion lens onto a specimen in front of the inner pole-piece of the magnetic immersion lens.

19. An electron microscope to be claimed in claim 18 in the form of a scanning electron microscope.

\* \* \* \* \*